United States Patent
Yang

(10) Patent No.: US 8,325,317 B2
(45) Date of Patent: Dec. 4, 2012

(54) LIQUID CRYSTAL DISPLAY FABRICATION METHOD

(75) Inventor: Joon-Young Yang, Bucheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/974,842

(22) Filed: Dec. 21, 2010

(65) Prior Publication Data

US 2011/0092008 A1    Apr. 21, 2011

Related U.S. Application Data

(62) Division of application No. 11/518,116, filed on Sep. 8, 2006, now Pat. No. 7,876,390.

(30) Foreign Application Priority Data

May 12, 2006 (KR) .................................. 2006-43149

(51) Int. Cl.
  *G02F 1/1343* (2006.01)
  *G02F 1/13* (2006.01)
(52) U.S. Cl. ........................................ 349/187; 349/141
(58) Field of Classification Search .................. 349/141, 349/187
  See application file for complete search history.

(56) References Cited

U.S. PATENT DOCUMENTS

| | | | |
|---|---|---|---|
| 4,969,718 A | 11/1990 | Noguchi et al. | |
| 6,014,190 A | 1/2000 | Kim et al. | |
| 6,166,785 A | 12/2000 | Ha | |
| 6,246,070 B1 | 6/2001 | Yamazaki et al. | |
| 6,261,881 B1 | 7/2001 | Yamazaki et al. | |
| 6,462,800 B1 | 10/2002 | Kim et al. | |
| 6,486,933 B1 | 11/2002 | Cha et al. | |
| 6,567,150 B1 | 5/2003 | Kim | |
| 6,617,203 B2 | 9/2003 | Kim et al. | |
| 6,674,106 B2 | 1/2004 | Tanaka et al. | |

(Continued)

FOREIGN PATENT DOCUMENTS

CN         1607445         4/2005

(Continued)

OTHER PUBLICATIONS

Office Action issued in corresponding German Application No. 10 2006 060 731.7-51, mailed on Jan. 23, 2008.

(Continued)

*Primary Examiner* — Mark Robinson
*Assistant Examiner* — Michael Inadomi
(74) *Attorney, Agent, or Firm* — Brinks Hofer Gilson & Lione

(57) ABSTRACT

A method of fabricating an LCD includes providing first and second substrates. A gate electrode, a gate line, a connection electrode, a common electrode and a pixel electrode are formed on the first substrate through a first making process. A first insulation film is formed on the first substrate. A first insulation film pattern having multiple contact holes are formed through a second masking process. An active pattern is formed on the first substrate and source and drain electrodes are operationally connected with the active pattern through some of the contact holes. A gate electrode, a common electrode, and a pixel electrode may be formed substantially together through a slit exposure. An active pattern and source and drain electrodes may be formed substantially together. The number of masks needed to fabricate the display may be reduced to simplify a fabrication process and protect a channel region.

37 Claims, 18 Drawing Sheets

U.S. PATENT DOCUMENTS

| | | | |
|---|---|---|---|
| 6,674,495 | B1 | 1/2004 | Hong et al. |
| 7,248,323 | B2 | 7/2007 | Ahn et al. |
| 7,369,202 | B2 | 5/2008 | Ahn et al. |
| 7,751,021 | B2 * | 7/2010 | Ahn et al. .................... 349/187 |
| 7,859,639 | B2 * | 12/2010 | Ahn .............................. 349/187 |
| 7,872,721 | B2 * | 1/2011 | Oh et al. ....................... 349/141 |
| 2001/0052598 | A1 | 12/2001 | Koga et al. |
| 2004/0189919 | A1 | 9/2004 | Ahn et al. |
| 2005/0036080 | A1 | 2/2005 | Koide |
| 2005/0078240 | A1 | 4/2005 | Murade |
| 2005/0133791 | A1 | 6/2005 | Yang |
| 2005/0140841 | A1 | 6/2005 | Yang et al. |
| 2005/0243230 | A1 | 11/2005 | Chen |
| 2006/0262263 | A1 | 11/2006 | Yang et al. |
| 2006/0273715 | A1 | 12/2006 | Yang et al. |

FOREIGN PATENT DOCUMENTS

| | | |
|---|---|---|
| CN | 1619392 | 5/2005 |
| DE | 102004015276 | 11/2004 |
| JP | 8-50308 | 2/1996 |
| JP | 8-136951 | 5/1996 |
| JP | 2000-180898 A | 6/2000 |
| JP | 2000-206571 A | 7/2000 |
| JP | 2001-235763 A | 8/2001 |
| JP | 2002-90779 A | 3/2002 |
| JP | 2003-57673 A | 2/2003 |
| JP | 2004-318076 A | 11/2004 |
| KR | 1999-74537 | 10/1999 |
| KR | 10-2002-0043402 A | 6/2002 |
| KR | 10-2002-0055784 A | 7/2002 |
| TW | 578243 B | 3/2004 |
| TW | 586144 B | 5/2004 |

OTHER PUBLICATIONS

Office Action issued in corresponding Chinese Patent Application No. 200610143115.1; issued Jun. 13, 2008.

Office Action issued in corresponding Taiwanese Patent Application No. 095146768; issued Sep. 29, 2009.

Office Action issued in corresponding Korean Patent Application No. 10-2006-0043149; issued Mar. 9, 2010.

Office Action issued in corresponding Japanese Patent Application No. 2006-336644; mailed Mar. 17, 2010.

* cited by examiner

LIQUID CRYSTAL DISPLAY FABRICATION METHOD

The present patent document is a divisional of U.S. patent application Ser. No. 11/518,116, filed Sep. 8, 2006, which claims priority to Korean Patent Application No. 43149/2006 filed in Korea on May 12, 2006, which is hereby incorporated by reference.

BACKGROUND

1. Field of the Invention

The present invention relates to a liquid crystal display (LCD), and more particularly, to an improved fabrication method

2. Discussion of the Related Art

Demand for information displays is growing as the demand for portable (mobile) information devices increases. In some devices thin flat panel displays (FPD) are used. These FPDs have Liquid Crystal Displays (LCD) that use an optical anisotropy of a liquid crystal. The medium exhibits excellent resolution, color, and picture quality.

Some LCDs have multiple substrates in which a liquid crystal layer is formed between a color filter substrate and an array substrate. Thin film transistors (TFTs) are used as switching elements in these displays. The LCD in FIG. 1 includes a color filter substrate 5, an array substrate 10, and a liquid crystal layer 30. The color filter substrate 5 includes color filters (C) that have sub-color filters 7 that generate red, green, and blue colors. Black matrixes 6 separate the sub-color filters 7 and block light transmission to the liquid crystal layer 30. A transparent common electrode 8 applies a voltage to the liquid crystal layer 30. The array substrate 10 of FIG. 1 includes a plurality of gate lines 16 and data lines 17 that form a plurality of pixel regions (P). TFTs are formed at each crossing of the gate lines 16 and data lines 17, and pixel electrodes 18 are formed on each pixel region (P).

The color filer substrate 5 and the array substrate 10 are attached in adjacent positions using a sealant. Two substrates 5 and 10 are attached through an attachment key.

The LCD shown in FIG. 1 is a twisted nematic (TN) type LCD in which nematic liquid crystal molecules are driven in a perpendicular direction relative to the substrates. When a voltage is applied to the liquid crystal display panel, liquid crystal molecules that have been aligned horizontally to the substrates are aligned in a vertical direction.

In FIG. 2, the N number of gate lines and M number of data lines in a plane switch (IPS) mode LCD cross each other to from M×N number of pixels on an array substrate. A gate line 16 and a data line 17 positioned vertically and horizontally form a pixel region on a transparent glass substrate 10. A TFT is formed at the crossing of the gate line 16 and the data line 17.

The TFT includes a gate electrode 21 connected to the gate line 16. A source electrode 22 is connected to the data line 17, and a drain electrode 23 is connected to a pixel electrode 18 through a pixel electrode line 181. The TFT includes a first insulation film for insulating the gate electrode 21 and the source and drain electrodes 22 and 23. An active pattern forms a conductive channel between the source electrode 22 and the drain electrode 23.

In the pixel region, a plurality of common electrodes 8 and a plurality of pixel electrodes 18 are alternately disposed in a direction parallel to the data line 17. The pixel electrodes 18 are connected with the pixel electrode line 181 through a first contact hole 40a. The pixel electrodes 18 are electrically connected with the drain electrode 23 and the common electrodes 8 are electrically connected to a common electrode line 81 in parallel with the gate line 16 through a second contact hole 40b.

In FIG. 3A, a gate electrode 21, a gate line, and a common line are formed on a substrate 10 through a photolithography process (a first making process). In FIG. 3B, a first insulation film 15a, an amorphous silicon thin film, and an n+ amorphous silicon thin film are sequentially deposited on the entire surface of the substrate 10 with the gate electrode 21. The gate line and the common line are then formed, and the amorphous silicon thin film and the n+ amorphous silicon thin film are selectively patterned using photolithography (a second masking process) to form an active pattern 24. At this stage, the n+ amorphous silicon thin film pattern 25 which has been patterned in the same form as the active pattern 24 is formed.

Thereafter, as shown in FIG. 3C, a conductive metal is deposited on the entire surface of the substrate 10 and then selectively patterned through photolithography (a third masking process). The photolithography forms a source electrode 22 and a drain electrode 23 at an upper portion of the active pattern 24. At this stage, a certain portion of the n+ amorphous silicon thin film pattern formed on the active pattern 24 is removed through the third masking process to form an ohmic contact layer 25n.

In FIG. 3c, a portion of the source electrode 22 extends in one direction to form the data line 17, and a portion of the drain electrodes 23 extends to the pixel region to form the pixel electrode line 181. Next, in FIG. 3D, a second insulation film 15b is deposited on the entire surface of the substrate 10 with the source electrode 22 and the drain electrode 23 formed. A portion of the second insulation film 15b is removed through photolithography (a fourth masking process) to form a contact hole 40a exposing a portion of the pixel electrode line 181. At this stage, another portion of the second insulation film 15b is removed through the fourth masking process to form a second contact hole exposing a portion of the common line.

Finally, as shown in FIG. 3E, a transparent conductive metal material is deposited on the entire surface of the substrate 10 and then selectively patterned using photolithography (a fifth making process) to form pixel electrodes 18 that are electrically connected with the pixel electrode line 181 and the common electrodes 8 that are electrically connected with the common line in FIG. 2.

When fabricating some array substrates that include TFTs, at least five photolithography processes are performed to pattern the gate electrode, the active pattern, the source and drain electrodes, the contact holes, and the pixel electrodes. Successive photolithography processes may degrade production yields, decrease reliability, and increase the likelihood of a defective TFT. Because the masks used to form pattern can be very expensive, as more masks are applied, the fabrication cost of the LCD increases. Therefore, there is a need for a cost efficient fabrication process that may increase production yields, improve reliability, and decrease production defects.

BRIEF SUMMARY

A method of fabricating an LCD includes forming a gate electrode, a gate line, a connection electrode, a common electrode and a pixel electrode, on a first substrate through a first making process. Once formed a first insulation film is formed on the first substrate. A first insulation film pattern having multiple contact holes is formed through a second masking process. An active pattern is then formed on the first substrate and source and drain electrodes that are coupled with a portion of the active pattern are then formed. The first substrate is then coupled to a second substrate.

Other systems, methods, features and advantages of the invention will be, or will become, apparent to one with skill in the art upon examination of the following Figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the Figures are not necessarily to scale, emphasis instead being placed upon illustrating the principles of the invention. Moreover, in the Figures, like referenced numerals designate corresponding parts throughout the different views.

DETAILED DESCRIPTION OF THE DRAWINGS AND THE PRESENTLY PREFERRED EMBODIMENTS

Figure 1:
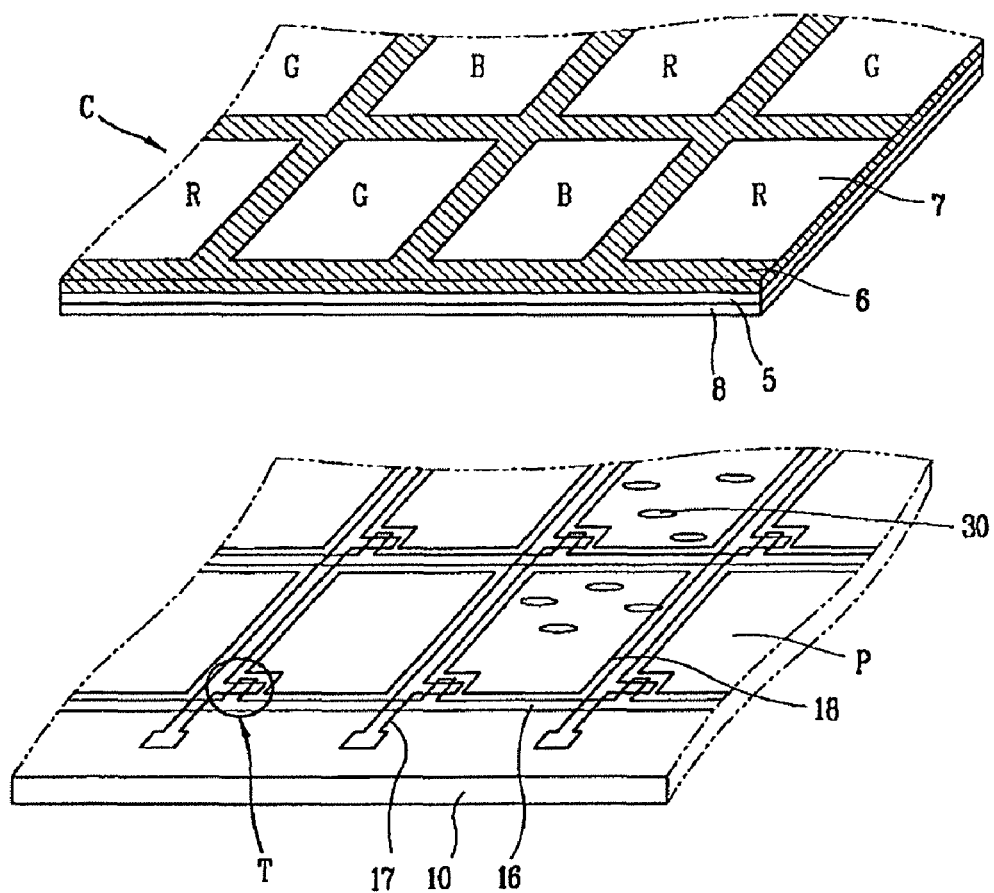
FIG. 1 is an exploded perspective view of a liquid crystal display.
Figure 2:
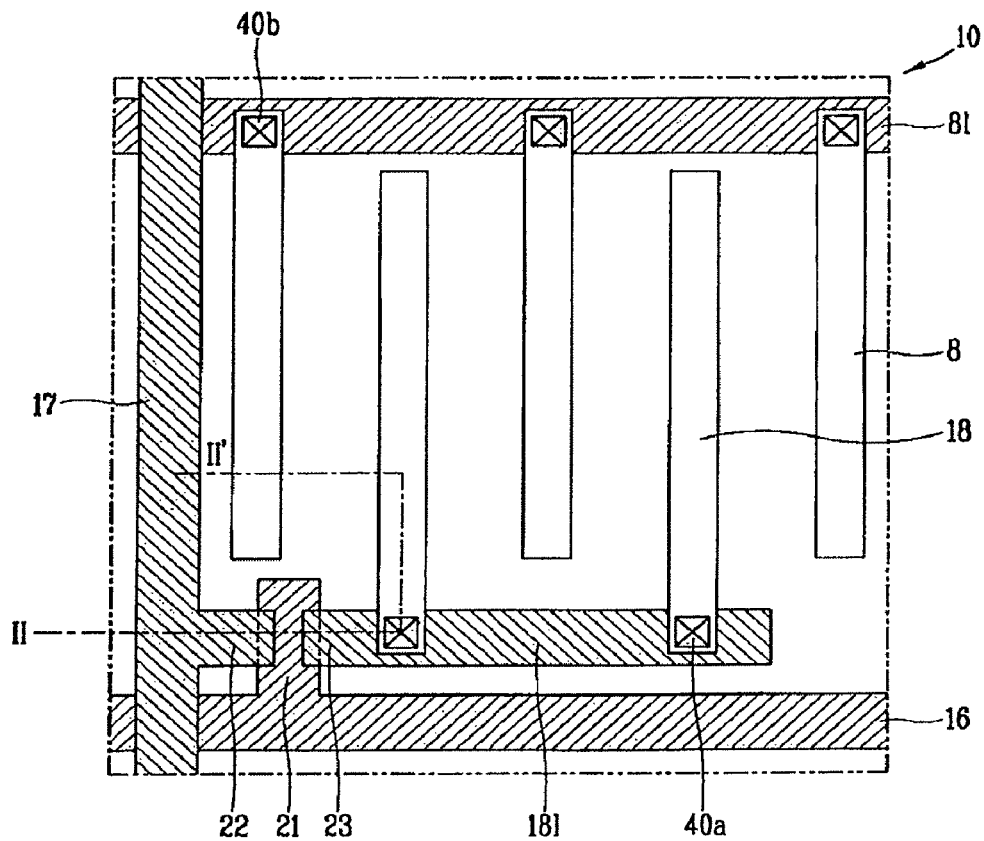
FIG. 2 is a plan view of a portion of an array substrate.
Figure 3A:
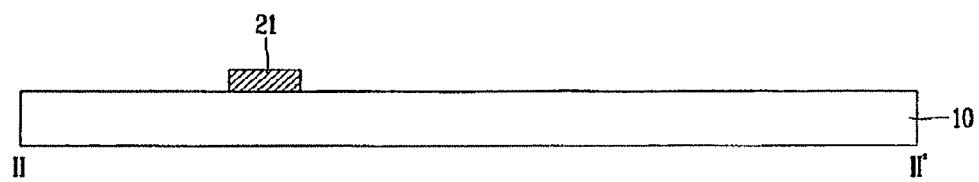
FIGS. 3A to 3E are sectional views taken along line II-II' of FIG. 2.
Figure 3B:
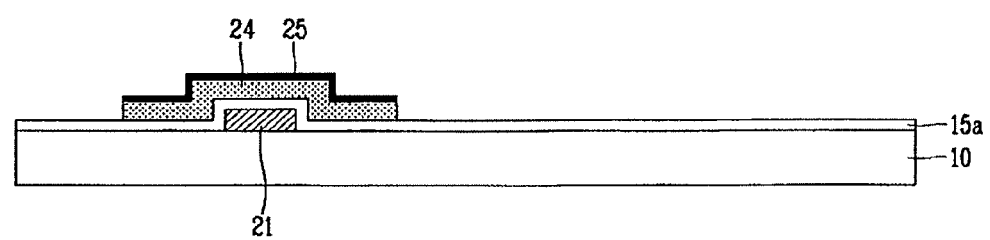
Figure 3C:
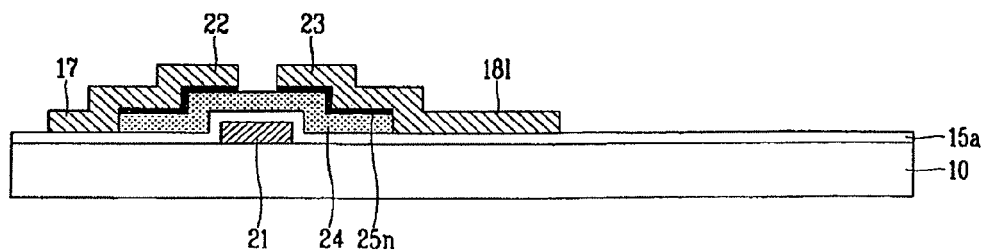
Figure 3D:
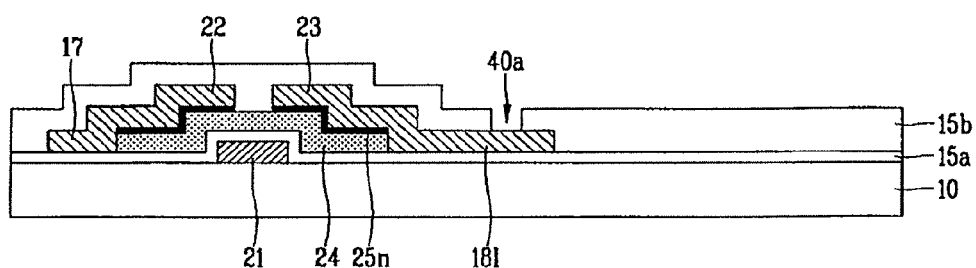
Figure 3E:
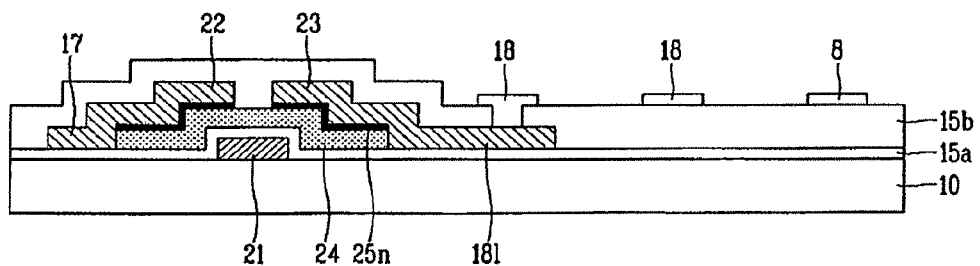
Figure 4:
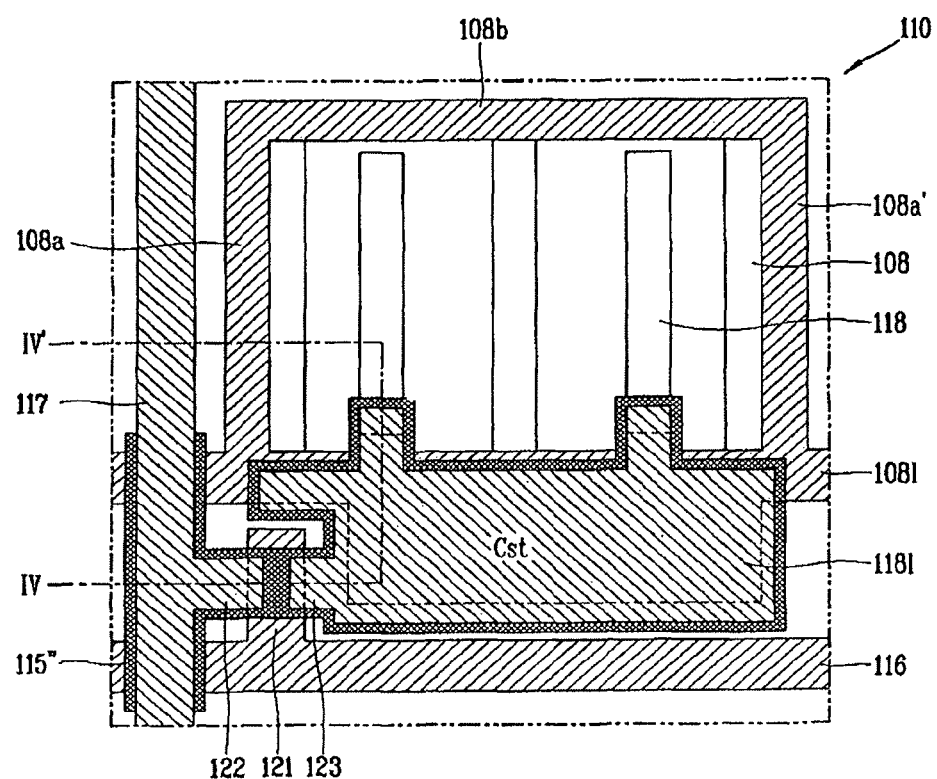
FIG. 4 is a plan view showing a portion of an array substrate of one pixel of an LCD.

In FIG. 4 the N number of gate lines and M number of data lines cross to form the M×N number of pixels on an array substrate. Gate lines 116 and data lines 117 are arranged vertically and horizontally to form a pixel region on an array substrate 110. A switching element is positioned at a crossing of the gate line 116 and the data line 117. In FIG. 4 the switching element comprises a thin film transistor (TFT).

The TFT includes a gate electrode 121 connected with the gate line 116, a source electrode 122 connected with the data line 117, and a drain electrode 123 connected with the pixel electrode 118 through the pixel electrode line 1181. The TFT includes a first insulation film that insulates the gate electrode 121 the source/drain electrodes 122 and 123, and an active pattern. The active pattern forms a conductive channel between the source and drain electrodes 122 and 123 when a gate voltage applied to the gate electrode 121. In FIG. 4, a portion of the source electrode 122 is coupled to the data line 117, and a portion of the drain electrode 123 extends into the pixel region to form the pixel electrode line 1181.

In the pixel region, two or more common electrodes 108 and two or more pixel electrodes 118 are alternately disposed to generate an in-plane field. In this figure the common electrodes 108 and the pixel electrodes 118 are arranged substantially parallel to the data line 117. In alternate systems the common electrodes 108 and the pixel electrodes 118 are arranged substantially parallel to the gate line 116 or are configured in other arrangements.

The pixel electrodes 118 are electrically or operationally connected with the pixel electrode line 1181 through a first contact hole. The common electrodes 108 are connected with the common line 1081 and are arranged substantially parallel to the gate line 116. The common line 1081 is connected with the first connection lines 108a and 108a'. These lines are substantially parallel to the data line 117 near the left and right edges of the pixel region. The first left and right connection lines 108a and 108a' are connected by a second connection line 108b arranged substantially parallel to the gate line 116.

The gate electrode 121, the gate line 116, the common line 1081, the first connection lines 108a and 108a' and the second connection line 108b are formed as a dual-layer. The dual layer comprises a lower layer made of a transparent conductive material and an upper layer made of an opaque conductive material. The common electrode 108 and the pixel electrode 118 exposed in the pixel region may be formed as a single layer made of the transparent conductive material.

A portion of the side or upper or lower surface of the common electrode 108 extends downwardly from the common line 1081, the first connections 108a and 108a', or the second connection line 108b to form a connection with the common line 1081, the first connection lines 108a and 108a', or the second connection line 108b. A portion of the common line 1081 overlaps a portion of the pixel electrode line 1181 with a first insulation film interposed therebetween to form a circuit element used to store charge or a storage capacitor (Cst). The storage capacitor (Cst) substantially sustains a voltage applied to a liquid crystal capacitor until a next signal is received.

Besides sustaining the signal, the storage capacitor (Cst) may stabilize a gray scale representation and/or may reduce a residual image. In FIG. 4 115" denotes an etch stopper comprised of an insulating material. A etch stopper positioned near an upper portion of a channel region of the active pattern may prevents a back channel of the TFT from being damaged when an n+ amorphous silicon thin film is etched.

The array substrate may be fabricated through a multi-step process. While the processes may be customized to specific elements and conditions, one process generated may pattern a circuit through less than five steps such as through three steps. Some processes form the gate electrode, the common electrode, and the pixel electrode substantially together and form the active pattern and the source and drain electrodes substantially together through a slit (diffraction) mask or half-tone mask. Other processes use other masks.

Figure 5A:
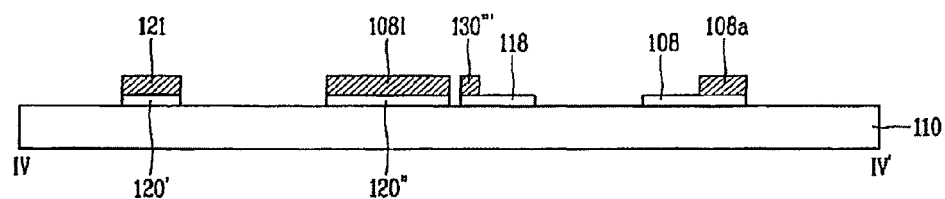
FIG. 5A to 5C are sectional views of a fabrication process taken along a line IV-IV' of the array substrate in FIG. 4.
Figure 6A:
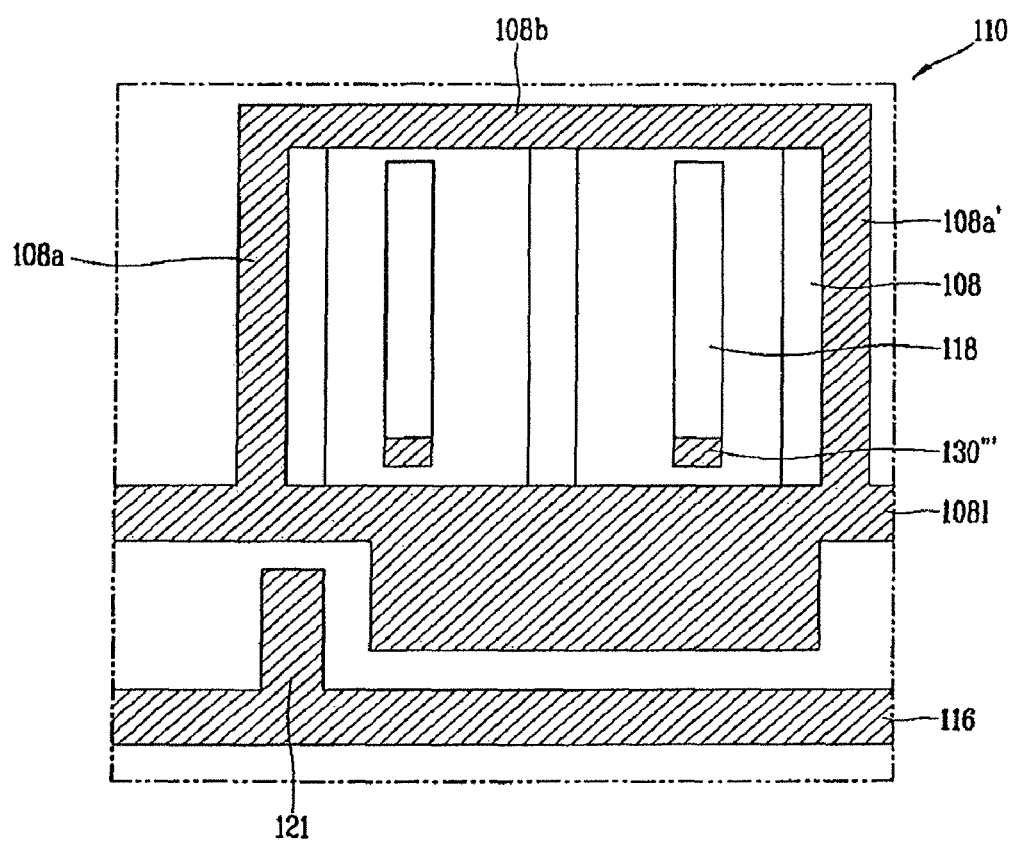
FIG. 6A to 6E are plan views of a fabrication process of the array substrate of FIG. 4.

In FIGS. 4, 5A, and 6A, the gate electrode 121, the gate line 116, the common line 1081, the first connection lines 108a and 108a', the second connection line 108b, the common electrode 108 and the pixel electrode 118 are formed on a substrate 110 comprising a transparent insulation material such as glass in these figures.

The gate electrode 121, the gate line 116, the common line 1081, the first connection lines 108a and 108a', the second connection line 108b, the common electrode 108 and the pixel electrode 118 are formed by patterning first and second films through a patterning process in which patterns are transferred to a wafer. In FIGS. 5 and 6 a photolithograph patterning process is used.

In some devices that use the first conductive film, a transparent conductive material with excellent transmittance such as indium tin oxide (ITO) and/or indium zinc oxide (IZO) may be used. In devices that use a second conductive film, a low resistance opaque conductive material such as aluminum (Al), an aluminum alloy, tungsten (W), copper (Cu), chromium (Cr), and/or molybdenum (Mo), etc. may be used.

In FIGS. 5 and 6 near the lower portion of the gate electrode 121, the gate line 116 and the common line 1081 are formed from the second conductive film. A gate electrode pattern 120', a gate line pattern, and a common line pattern 120" are patterned to form the gate electrode 121, the gate line 116, and the common line 1801.

A side or a portion of the upper and lower surfaces of the common electrode 108 formed of the first conductive film extends to the lower surface of the common line 1081. The first connection lines 108a and 108a' or the second connection line 108b, and a portion of a lower surface of the pixel electrode 118 formed of the first conductive film extends to the lower surface of the connection electrode 130''' formed of the second conductive film.

The gate electrode 121, the gate line 116, the common line 1081, the first connection lines 108a and 108a' and the second connection line 108b comprising the second conductive film may be formed simultaneously or nearly simultaneously with the common electrode 108 and the pixel electrode 118 formed of the first conductive film.

Figure 7A:
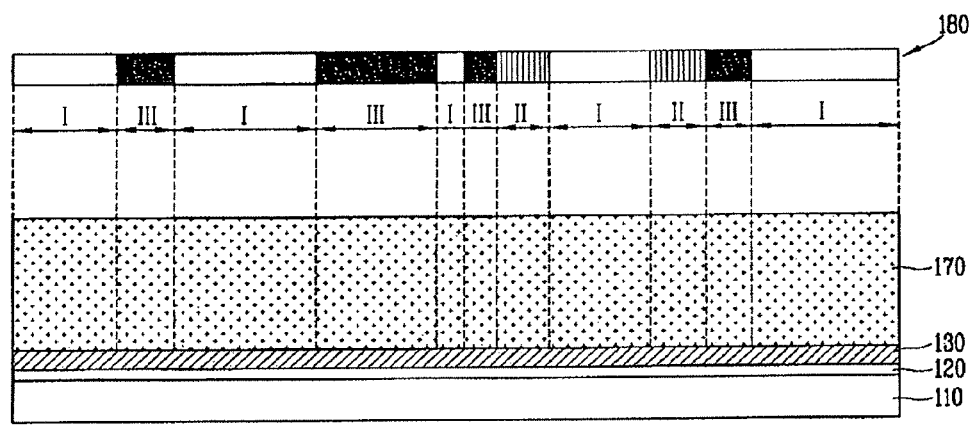
FIGS. 7A to 7E are sectional views of a first masking process of FIGS. 5A and 6A.
Figure 7B:
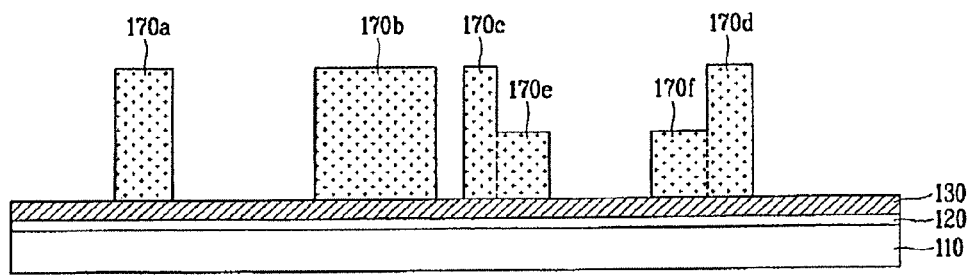
Figure 7C:
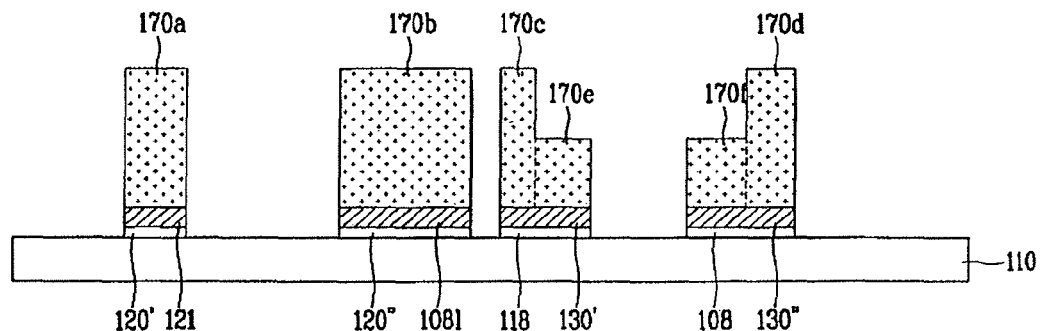
Figure 7D:
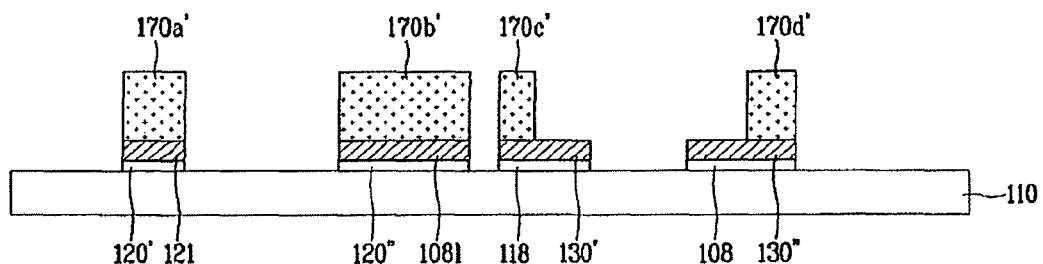
Figure 7E:
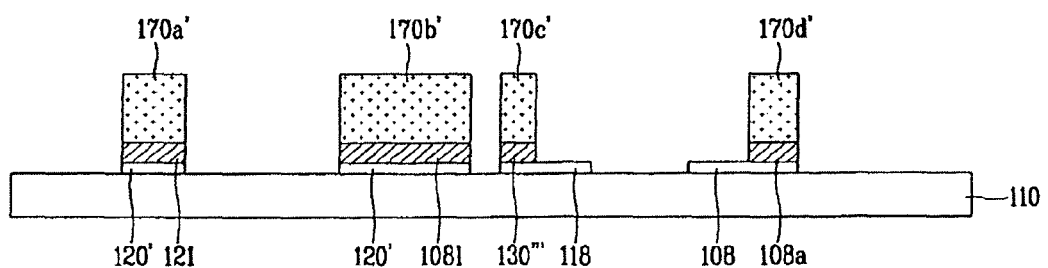

FIGS. 7A to 7E are sectional views showing the first masking process of FIGS. 5A and 6A. In FIG. 7A, the first and second conductive films 120 and 130 are deposited on the entire surface or nearly the entire surface of the substrate 110. The conductive films may be made of a transparent insulation material such as glass and the process may occur sequentially. In some devices the first conductive film 120 comprises a transparent conductive material such as indium tin oxide (ITO) or indium zinc oxide (IZO). A low resistance opaque conductive material such as aluminum (Al), an aluminum alloy, tungsten (W), copper (Cu), chromium (Cr), molybdenum (Mo), and/or a molybdenum alloy, etc. may comprise the second conductive film 130. Thereafter, a photosensitive film 170 made of a photosensitive material such as photoresist is formed on the entire surface or nearly the entire surface of the substrate 110, on which light is selectively allowed to pass through a plate covered with an array of patterns. A slit mask 180 (or a half-tone mask) or in an alternate process a multi-slit mask may be used.

The slit mask 180 may include a transmission region (I) for allowing light to pass through, a slit region (II) with a slit pattern that transmits only a portion of light while blocking a portion of light, and a blocking region (III) for preventing light to pass through. In some processes only light that is transmitted through the slit mask 180 may irradiate the photosensitive film 170.

When a photosensitive film 170 that has been exposed through the slit mask 180 is developed, (FIG. 7B), photosensitive film patterns 170a~170f housing a certain thickness may remain at regions where light has been entirely blocked or partially blocked. Light may be blocked by the blocking region (III) and the slit region (II). Photosensitive film at the transmission region (I) to which light has been almost entirely transmitted or allowed to pass through has been almost completely removed due to the expose of the surface of the second conductive film 130.

At this stage, the first to fourth photosensitive film patterns 170a to 170d formed through the blocking region (III) are thicker than fifth and sixth photosensitive film patterns 170e and 170f formed at the slit region (II). The photosensitive film at the region to which light has been almost entirely transmitted through (the transmission region (I)) is almost completely removed. In this process a positive photoresist was used. In alternate processes a negative photoresist or a combination may be used.

When the first and second conductive films 120 and 130 formed at the lower portion are patterned, that may use photosensitive film patterns 170a to 170f as masks (FIG. 7C), while the gate electrode 121, the gate line, and the common line 1081 are formed from the second conductive film. The common electrode 108 and the pixel electrode 118 made from the first conductive film are also formed on the substrate 110.

Near the lower portion of the gate electrode 121, the gate line, and the common line 1081, a gate electrode pattern 120', a gate line pattern, and a common line pattern 120" are formed from the first conductive film. These elements have been patterned in the same form as the gate electrode 121 and the common line 1081.

Near an upper portion of the common electrode 108 and the pixel electrode 118 (formed from the first conductive film), a connection electrode conductive film pattern 130', and connection line conductive film pattern 130", are formed from the second conductive film. These elements have been patterned in the same form as the common electrode 108 and the pixel electrode 118.

When an ashing process is performed to remove a portion of the photosensitive film patterns 170a to 170f (FIG. 7D), the fifth photosensitive film pattern 170e and the sixth photosensitive film pattern 170f of the upper portion of the connection electrode conductive film pattern 130' and the connection line conductive film pattern 130" may be almost or completely removed. These areas may correspond the slit region (II) where the slit has been exposed to light. The areas expose the surface of the connection electrode conductive film pattern 130' and the connection line conductive film pattern 130".

At this stage, the first to fourth photosensitive film patterns, respectively, remain as the seventh to tenth photosensitive film patterns 170a' to 170f' with a thickness obtained by removing the thickness of the fifth and sixth photosensitive film patterns at a certain portion that corresponds to the blocking region (III). The connection electrode conductive film pattern and the connection line conductive film patterns are then selectively removed through the seventh to tenth photosensitive film patterns 170a' to 170f' as masks to form a connection electrode 130'''. The electrode 130" is connected with a portion of the pixel electrode at an upper portion of the pixel electrode 118. During the process the first connection line 108a which is electrically or operationally connected with a portion of the common electrode 108 and the second connection line are formed near an upper portion of the common electrode 108.

Figure 5B:
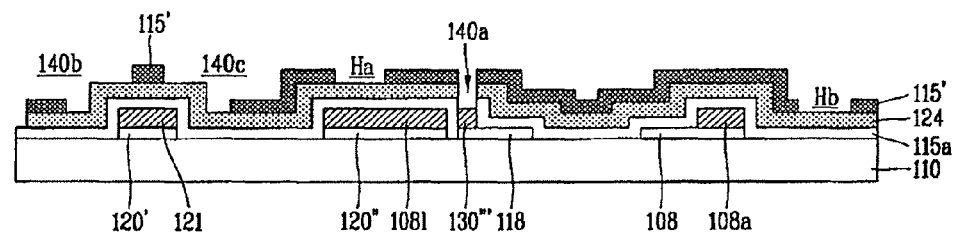
Figure 6B:
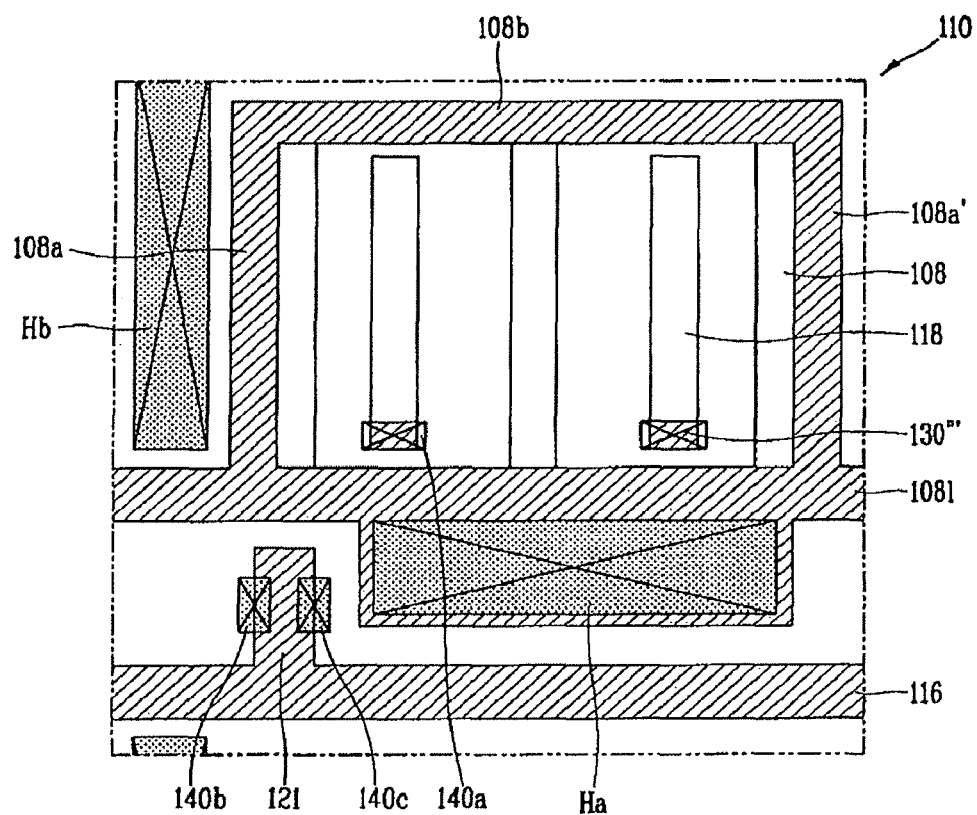

In FIGS. 5B and 6B, on almost the entire surface or the entire surface of the substrate 110 on which the gate electrode 121, the gate line 116, the common line 1081, the first connection lines 108a and 108', the second connection line 108b, the common electrode 108, the pixel electrode 118 are supported, a first insulation film 115a, an amorphous silicon thin film 124, and a second insulation film are deposited. In some process, the film is deposited. In some processes these elements are deposited sequentially. Once deposited the first insulation film 115a, the amorphous silicon thin film 124, and the second insulation film are patterned by a patterning process such as photolithography (a second masking process) that may also occur sequentially. The process may form a first contact hole 140a, a second contact hole 140b, a third contact hole 140c, a first hole Ha and a second hole Hb. Almost at the same time the process may form an etch stopper 115' comprising the second insulation film in a desire form.

At this stage, the first contact hole 140a exposes a portion of the connection electrode 130''', and the second and third contact holes 140b and 140c expose a portion of the amorphous silicon thin film 124 near the left and right upper portions of the gate electrode 121. The partial etch stopper 115' remaining after patterning process between the second and the third contact holes 140b and 150c may prevent an infiltration of an etching solution or an etching gas into a back channel of the active pattern when the n+ amorphous silicon thin film is patterned.

Figure 8A:
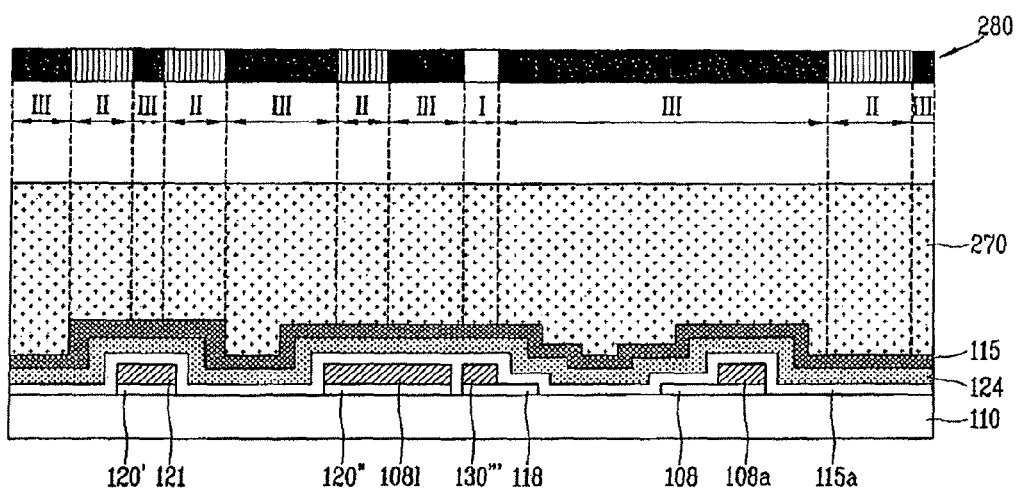
FIGS. 8A to 8E are sectional views of a second masking process of FIGS. 5B and 6B.
Figure 8B:
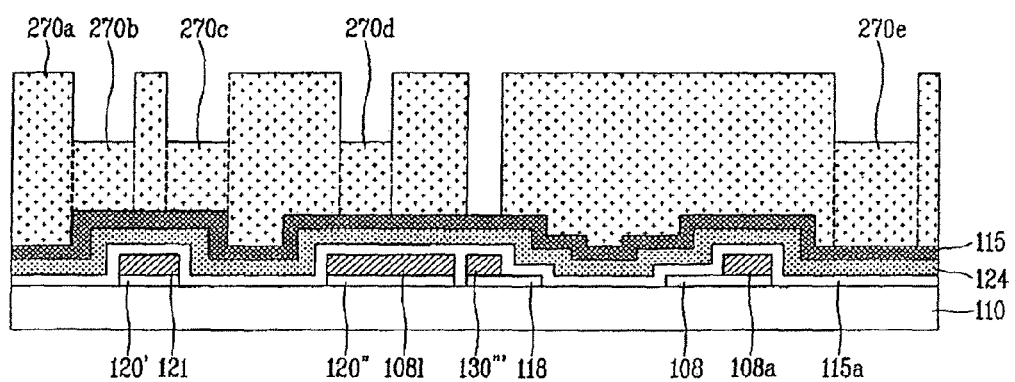
Figure 8C:
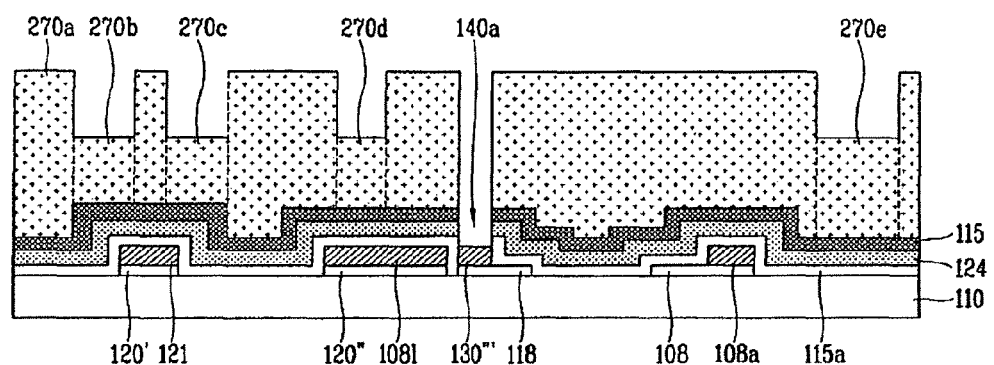
Figure 8D:
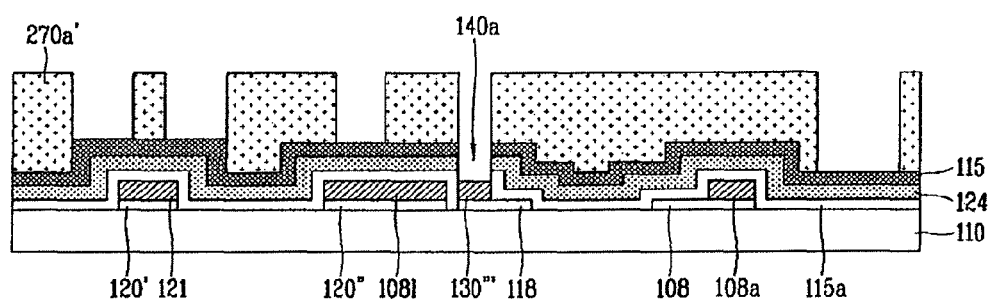

In some systems and processors, the slit exposure or multi-slit exposure is used for the second masking process. FIGS. 8A to 8E are sectional views of the second masking process of FIGS. 5B and 6B. In FIG. 8A, on almost the entire surface or the entire surface of the substrate 110 on which the gate electrode 121, the gate line 116, the common line 1081, the first connection lines 108a and 108a' are supported, the second connection line 108b, the common electrode 108, and the pixel electrode 118 are formed, and the first insulation film 115a, the amorphous silicon thin film 124, and the second insulation film 115 are deposited. In some systems this occurs sequentially. A photosensitive film 270 comprised of a photosensitive material such as a photoresist is formed on nearly the entire surface or the entire surface of the substrate 110, on which light is selectively passed through a slit mask 280 (or a half-tone mask).

The slit mask 280 may include a transmission region (I) for allowing light to pass through, a slit region (II) with a slit pattern that transmits only a portion of light while blocking a portion of light, and a blocking region (III) for preventing light to pass through. In some processes only light which is transmitted through the slit mask 280 may irradiate the photosensitive film 270.

When the photosensitive film 270 that has been exposed through the slit mask 280 is developed (FIG. 8B), photosensitive film patterns 270a~270e having a certain thickness remain at regions where light has been entirely blocked or partially blocked. Light may be blocked by the blocking region (III) and the slit region (II). Photosensitive film at the transmission region (I) to which light has been entirely transmitted or allowed to pass through has been almost completely or entirely removed due to the expose of the surface of the second insulation film 115.

At this stage, the first photosensitive film pattern 270a formed through the blocking region (III) is thicker than the second to fifth photosensitive film patterns 270b to 270e formed at the slit region (II). The photosensitive film at the region to which light has been almost entirely transmitted through (the transmission region (I)) is almost completely removed. In this process a positive photoresist is used. In alternate processes negative photoresist or a combination may be used.

When the first insulation film 115a, the amorphous silicon thin film 124, and the second insulation film 115 are patterned, which may occur through photosensitive film patterns 270a to 270e that act as masks (FIG. 8C), the first contact hole 140a is formed exposing a portion of the connection electrode 130'''.

When an ashing process is performed to remove a portion of the photosensitive film patterns 270a to 270e (FIG. 8D), the second to sixth photosensitive film patterns at the slit region (II) to which the slit exposure has been applied may be almost completely removed to expose the surface of the second insulation film 115.

Figure 8E:
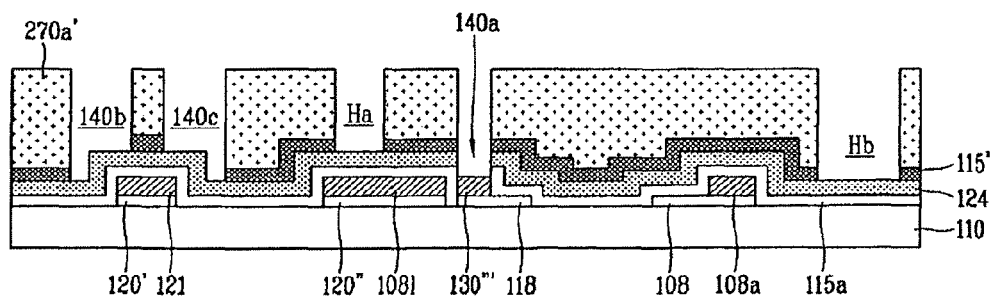

At this stage, the first photosensitive film pattern remains as the sixth photosensitive film pattern 270a' with a thickness obtained by removing the thickness of the second to fifth photosensitive film patterns at a certain portion corresponding to the blocking region (III). As shown in FIG. 8E, when a portion of the second insulation film is removed by using the sixth photosensitive film pattern 270a' as a mask, the second and third contact holes 140b and 140c are formed. The second and third contact holes 140b and 140c expose a portion of the amorphous silicon thin film 124 at the left and right upper portions of the gate electrode 121. At the same time or nearly the same time, a first hole Ha exposing a portion of the amorphous silicon thin film 124 of the upper portion of the common line 1081 and a second hole Hb exposing a portion of the amorphous silicon thin film 124 where a data line is to be formed are formed.

Figure 5C:
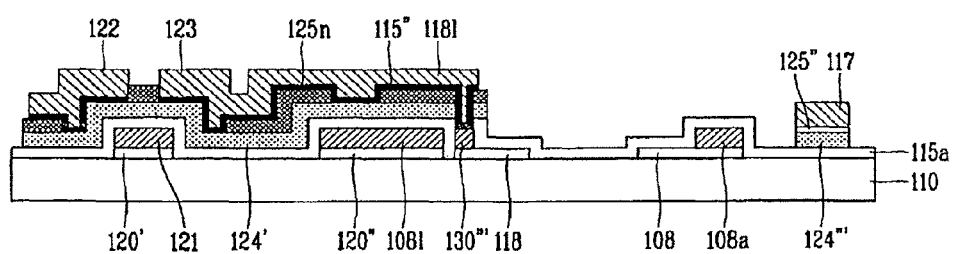
Figure 6C:
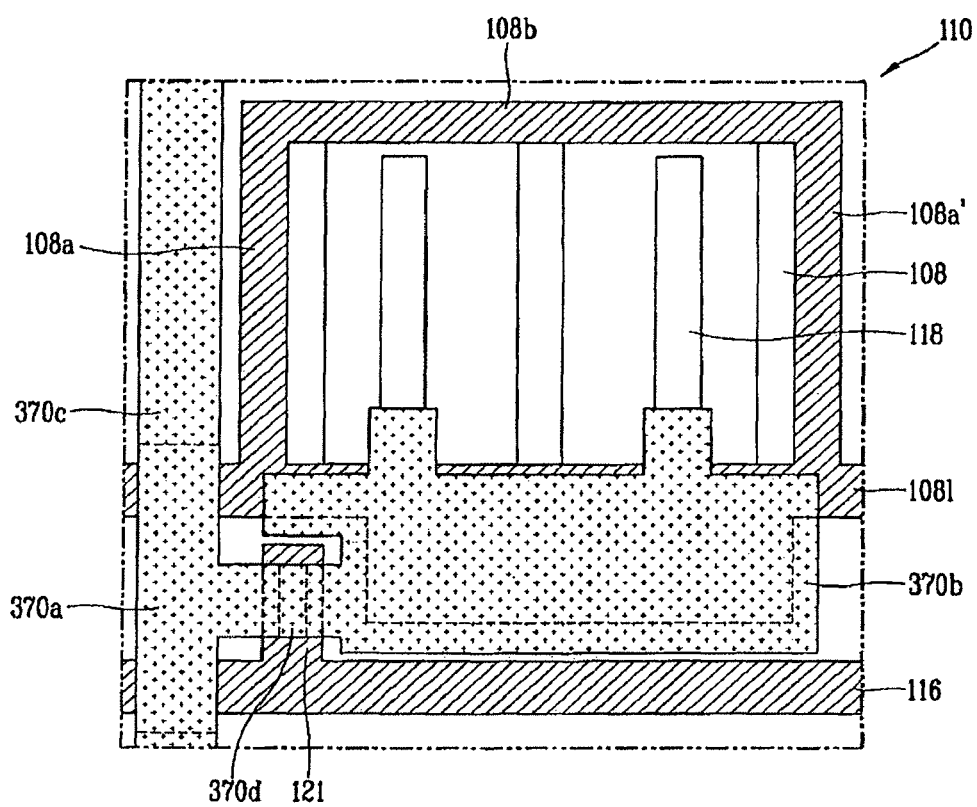
Figure 6D:
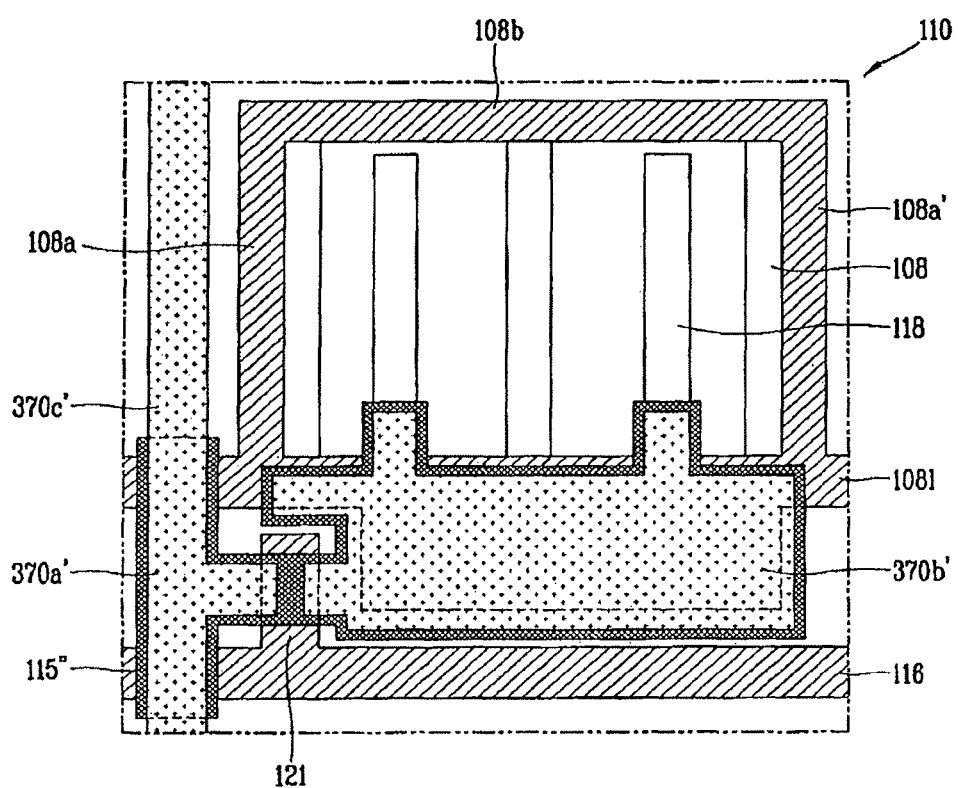
Figure 6E:
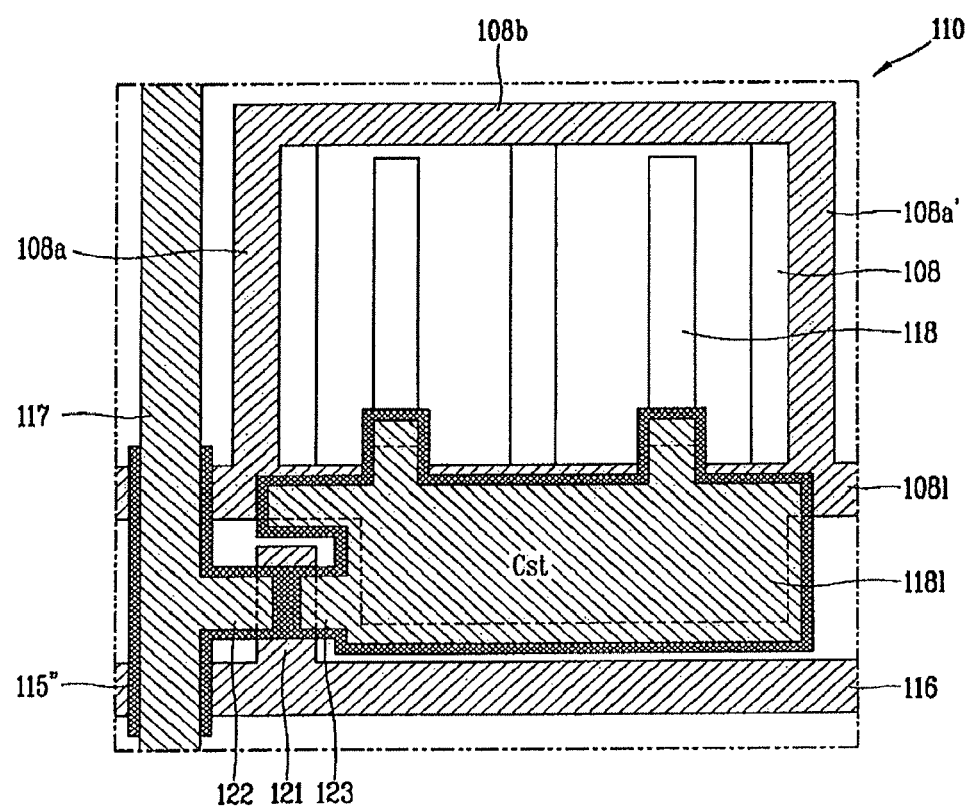

At this stage, the second insulation film where the first to third contact holes 140a to 140c and the first and second holes Ha and Hb have been patterned forms a first insulation film pattern 115'. In FIGS. 5C, 6C and 6E, an active pattern 124' is formed. At the same time or nearly the same time the source and drain electrodes 122 and 123 that are electrically or operationally connected to a certain portion of the active pattern 124' through the second and third contact holes are formed through a single patterning process or photolithography process (a third masking process). At this stage, a portion of the source electrode 122 extends in one direction and connects with the data line 117. The data line is substantially perpendicular to the gate line 116. A portion of the drain electrode 123 extends to the pixel electrode to form the pixel electrode line 1181 that is electrically or operationally connected with the connection electrode 130''' and the lower pixel electrode 118 through the first hole.

The first insulation film pattern formed of the second insulation film is patterned in a certain form through the third masking process to form an etch stopper 115''. The etch stopper 115'' positioned at the upper portion of the channel region of the active pattern 124' may prevent or minimize a back channel of the TFT from being damaged when the n+ amorphous silicon thin film is etched.

Figure 9A:
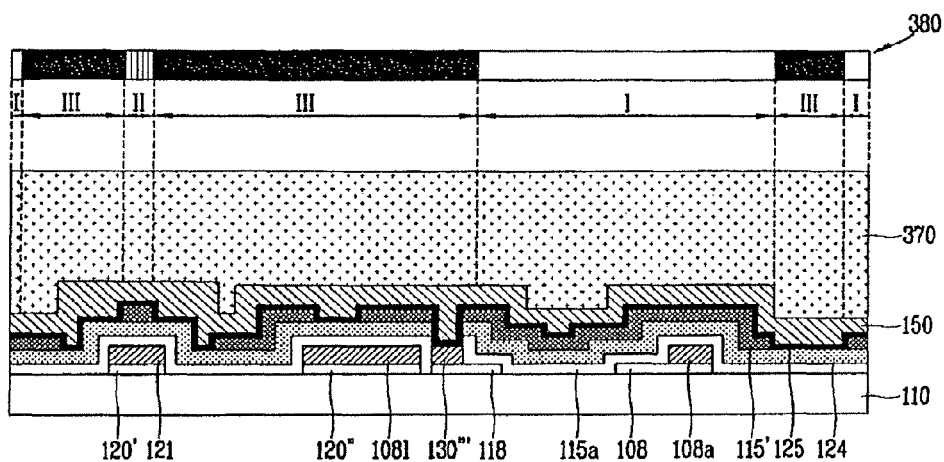
FIG. 9A to 9F are sectional views showing a third masking process of FIGS. 5C and 6C to 6E.
Figure 9B:
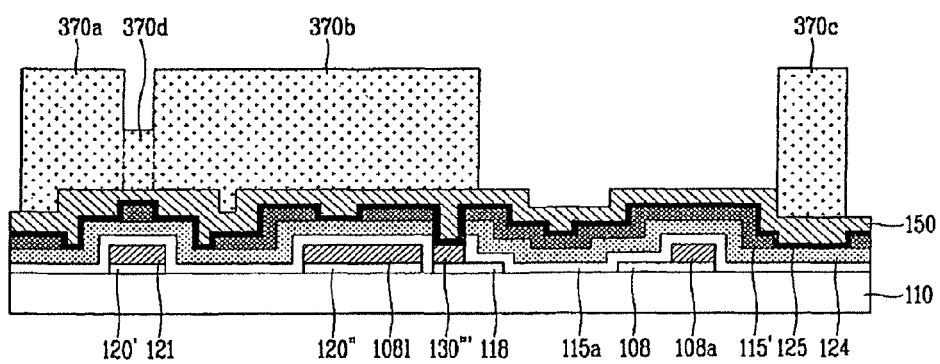
Figure 9C:
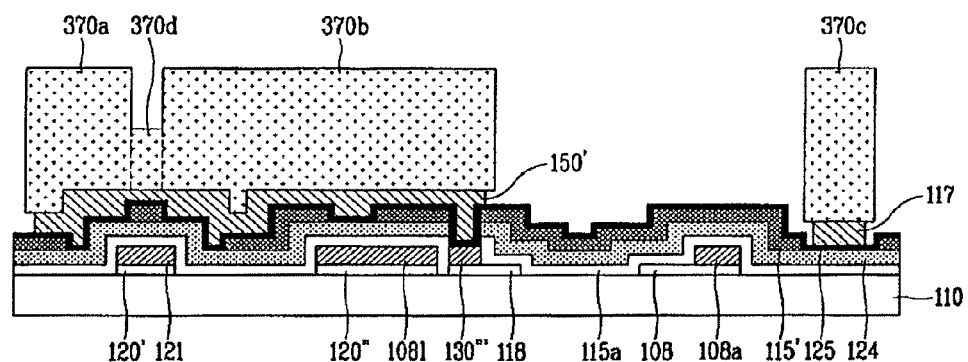

FIGS. 9A to 9F are sectional views showing a third masking process in FIGS. 5C and 6C to 6E. In FIG. 9A, an n+ amorphous silicon thin film 125b and a third conductive film 150 are deposited on the entire surface or nearly the entire surface of the substrate 110, a photosensitive film 370 made of a photosensitive material such as photoresist is formed on almost the entire surface or nearly the entire surface of the substrate 110, and then light is selectively passed onto the photosensitive film 370 through the slit mask (or the half-tone mask) 380 in alternate processes a multi-slit mask may be used.

The slit mask 380 may include a transmission region (I) for allowing light to pass through, a slit region (II) with a slit pattern for transmitting only a portion of light and blocking a portion of light, and a blocking region (III) for preventing light to pass through. In some processes only light that is transmitted through the slit mask 380 may be irradiated on the photosensitive film 370.

When the photosensitive film 370 that has been exposed through the slit mask 380 is developed. (9B), photosensitive film patterns 370a~370d with a certain thickness remain at regions where light has been entirely blocked or partially blocked through the blocking region (III) and the slit region (II). Photosensitive film at the transmission region (I) to which light has been almost entirely transmitted or allowed to pass through is almost completely removed due to the expose of the surface of the third conductive film 150.

At this stage, the first to third photosensitive film patterns 370a to 370c formed through the blocking region (III) are thicker than the fourth photosensitive film pattern 370d formed at the slit region (II). The photosensitive film at the region to which light has been almost entirely transmitted through the transmission region (I) is almost completely removed. For this process a positive photoresist is used. In alternate processes negative photoresist or a combination may be used.

When the third conductive film 150 is patterned in which photosensitive film patterns 370a to 370d are used as masks (FIG. 9C), a third conductive film pattern 150' formed of a third conductive film having a width narrower than a portion of the first photosensitive film pattern 370a, the second photosensitive film pattern 370b, and the fourth photosensitive film pattern 370d are formed. These patterns are formed at a lower portion of the first photosensitive film pattern 370a, the second photosensitive film pattern 370b, the fourth photosensitive film pattern 370d, and the data line 117. The data line 117 is formed of the third conductive film and has a width narrower than the other remaining portion of the first photosensitive film pattern 370a and the third photosensitive film pattern 370c.

Figure 9D:
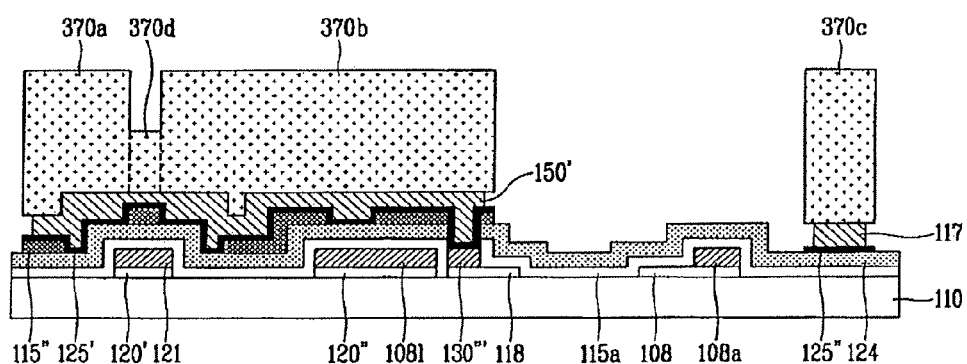
Figure 9E:
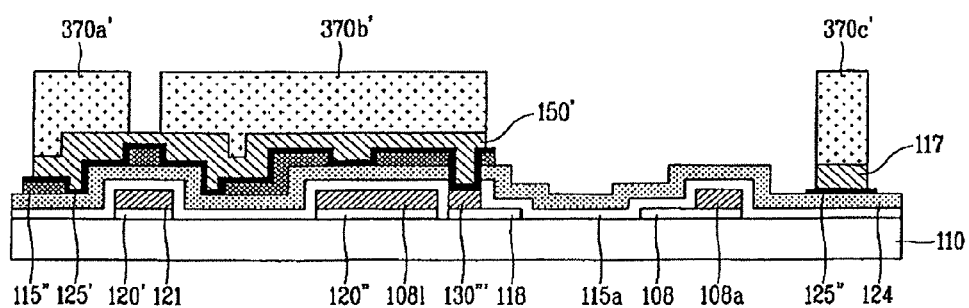

When the n+ amorphous silicon thin film 125 and the first insulation film pattern 115' are selectively patterned by a patterning process that may use photosensitive film patterns 370a to 370d as masks, as in FIG. 9D, a first n+ amorphous silicon thin film pattern 125' and a secondary insulation film pattern 115" formed of the n+ amorphous silicon thin film and the second insulation film are formed. These elements are formed at the lower portion of the first photosensitive film pattern 370a, the second photosensitive film pattern 370b, and the fourth photosensitive film pattern 370d. A second n+ amorphous silicon thin film pattern 125" formed of the n+ amorphous silicon thin film is formed at the lower portion of the first photosensitive film pattern 370a and the third photosensitive film pattern 370c. When an asking process is performed to remove a portion of the photosensitive patterns 370a to 370d, as in FIG. 9E, the fourth photosensitive film pattern at the slit region (II) to which exposure occurs is almost completely removed. This removal expose the surface of the third conductive film pattern 150'.

The first to third photosensitive film patterns, respectively, remain as fifth to seventh photosensitive film patterns 370a' to 370c'. The thickness may be obtained by reducing the thickness of the fourth photosensitive film pattern only at a certain region corresponding to the blocking region (III) in some processes. The fifth to seventh photosensitive film patterns 370a' to 370c' may be reduced in their width through an ashing process. By controlling process conditions of the ashing process, the fifth to seventh photosensitive film patterns 370a' to 370c' may have about the same width as that of the lower third conductive film pattern 150' and the data line 117.

Figure 9F:
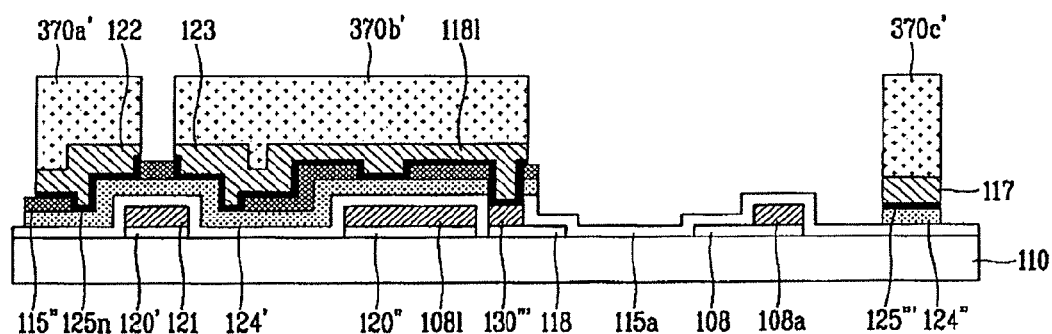

In FIG. 9F, when a portion of the third conductive film pattern is removed when the remaining fifth to seventh photosensitive film patterns 370a' to 370c' are used as masks, the source electrode 122 formed of a third conductive film is formed at a partial lower portion of the fifth sensitive film pattern 370a'. At the same time or nearly the same time the drain electrode 123 and the pixel electrode line 1181 formed of the third conductive film are formed at a lower portion of the sixth photosensitive film pattern 370b'.

When the first and second n+ amorphous silicon thin film patterns and the amorphous silicon thin film are selectively removed when using the fifth to seventh photosensitive film patterns 370a' to 370c' as masks, the active pattern 124' are formed from the amorphous silicon thin film. The silicon patterns are patterned according to the side of the edge of the etch stopper 125'. In one process, the etch stopper 125' is used as a mask in patterning the active pattern 124', and the ohmic-contact layer 125'. The ohmic contact layer is formed of the n+ amorphous silicon thin film and ohmic-contacting a certain portion of the active pattern 124'. The source and drain electrodes 122 and 123 are formed at the upper portion of the active pattern 124'.

The pixel electrode line 1181 is electrically connected with the lower connection electrode 130''' through the ohmic-contact layer 125n. The third n+ amorphous silicon thin film pattern 125''' and the amorphous silicon thin film pattern 124'' are formed of the n+ amorphous silicon thin film and the amorphous silicon thin film is formed at the lower portion of the data line 117.

The amorphous silicon thin film pattern 124" at the region where the second hole is formed is patterned in the same form as the upper data line 117. When the active pattern 124', the source and drain electrodes 122 and 123, and the data line 117 are formed through the single masking process, few or no projections are formed at the amorphous silicon thin film pattern 124" formed at the lower portion of the data line 117. By minimizing or substantially eliminating the projections, noise and/or other interference may be minimized. The array substrate 110 is attached in a facing manner with a color filter substrate through a resin or a sealant positioned at an outer edge of an image display region to form a liquid crystal panel. The two substrates may be coupled or attached by an attachment key. The attachment key may be formed on the array substrate 110 and the color filter substrate.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A method of fabricating a liquid crystal display comprising:
    forming a gate electrode pattern, a gate line pattern, a common electrode and a pixel electrode formed of a first conductive film on a first substrate through a first masking process, wherein the common electrode and the pixel electrode are formed as a single layer;
    forming a gate electrode, a gate line, and a connection electrode formed of a second conductive film on a first substrate through the first masking process, wherein the gate electrode pattern and the gate line pattern are patterned near the lower portion of the gate electrode and the gate line, respectively;
    forming a first insulation film on the first substrate on which the gate electrode, the gate line, the connection electrode, the gate electrode pattern, the gate line pattern, the common electrode and the pixel electrode are formed;
    forming an active pattern on the first insulation film;
    forming a second insulation film on the substrate to expose a pixel region;
    forming a first contact hole exposing a portion of the connection electrode, and second and third contact holes exposing a portion of the active pattern near the left and right potions of the gate electrode, respectively, through a second masking process;
    forming an etch stopper between the second and third contact holes on the active pattern, wherein the etch stopper is formed of the second insulation film;
    forming source and drain electrodes that are operationally connected with the portion of the active pattern through the second and third contact holes, respectively; and
    attaching the first substrate to a second substrate.

2. The method of claim 1, further comprising forming a common line on the first substrate through the first masking process.

3. The method of claim 2, where the common line is arranged substantially parallel to the gate line.

4. The method of claim 2, where the common electrode is coupled to the common line.

5. The method of claim 2, where the second masking process comprises:
  forming an amorphous silicon thin film and a second insulation film on the first substrate;
  forming a first photosensitive film pattern with a first thickness and a second photosensitive film pattern, a third photosensitive film pattern, a fourth photosensitive film pattern, a fifth photosensitive film pattern with a second thickness on the first substrate;
  selectively removing a portion of the first insulation film, an amorphous silicon thin film, and a portion of the second insulation film through a first photosensitive film pattern, a second photosensitive film pattern, a third photosensitive film pattern, a fourth photosensitive film pattern, and a fifth photosensitive film pattern used as masks that form at least a first contact hole exposing a portion of the connection electrode;
  removing the second photosensitive film pattern, the third photosensitive film pattern, the fourth photosensitive film pattern, the fifth photosensitive film pattern and at nearly the same time removing a portion of the first photosensitive film pattern to form a sixth photosensitive film pattern with a third thickness; and
  selectively removing a portion of the second insulation film through a sixth photosensitive film pattern as a mask to form a second contact hole and a third contact hole exposing a portion of the amorphous silicon thin film near left and right upper portions of the gate electrode.

6. The method of claim 5, further comprising forming a first hole that exposes a portion of the amorphous silicon thin film at an upper portion of the common line and forming a second hole exposing a portion of the amorphous silicon thin film of the region where a data line is to be formed.

7. The method of claim 5, where the second insulation film forms the etch stopper as the first contact hole, the second contact hole, and the third contact hole are patterned.

8. The method of claim 5, where the first photosensitive film pattern is patterned into the sixth photosensitive film pattern with a third thickness obtained by reducing the thickness of the second photosensitive film pattern, the third photosensitive film pattern, the fourth photosensitive film pattern, the fifth photosensitive film pattern through an ashing process.

9. The method of claim 5, where the first thickness is thicker than the second thickness.

10. The method of claim 1, further comprising forming a first connection line on the first substrate through the first masking process.

11. The method of claim 10, further comprising forming a data line substantially crossing the gate line to form a pixel region through a third masking process.

12. The method of claim 11, where the first connection line is arranged substantially parallel to the data line.

13. The method of claim 11, wherein a portion of a drain electrode extends to the pixel region to form a pixel electrode line that is operationally connected with the connection electrode and the pixel electrode through the first hole.

14. The method of claim 10, further comprising forming a second connection line on the first substrate through the first masking process.

15. The method of claim 14, where the first connection line is connected with the second connection line.

16. The method of claim 14, wherein the second connection line is arranged substantially parallel to the gate line.

17. The method of claim 1, wherein the first connection electrode is connected with a portion of the pixel electrode at an upper portion of the pixel electrode.

18. The method of claim 1, wherein the first masking process comprises:
  forming a first and a second conductive film on the first substrate;
  forming a first photosensitive film pattern, a second photosensitive film pattern, a third photosensitive film pattern, and a fourth photosensitive film pattern with a first thickness, and forming a fifth photosensitive film pattern and a sixth photosensitive film pattern with a second thickness on the first substrate;
  selectively removing the first conductive film and the second conductive film through the first photosensitive film pattern, the second photosensitive film pattern, the third photosensitive film pattern, the fourth photosensitive film pattern, the fifth photosensitive film pattern, and a sixth photosensitive film pattern as masks to form a gate electrode;
  forming a gate line formed of the first conductive film and a common electrode and a pixel electrode formed of the first conductive film on the first substrate.

19. The method of claim 18, wherein the first masking process further comprises:
  forming a connection electrode conductive film pattern and a connection line conductive film pattern, which are formed of the second conductive film, at an upper portion of the pixel electrode and the common electrode formed of the first conductive film pattern, in the same form as the pixel electrode and the common electrode respectively;
  removing the fifth photosensitive film pattern and sixth photosensitive film pattern while removing a portion of the first photosensitive film pattern, the second photosensitive film pattern, the third photosensitive film pattern, and the fourth photosensitive film pattern to form a seventh photosensitive film pattern, an eighth photosensitive film pattern, a ninth photosensitive film pattern, and a tenth photosensitive film pattern with a third thickness; and
  selectively removing the connection electrode conductive film pattern and the connection line conductive film pattern by using the seventh photosensitive film pattern, the eighth photosensitive film pattern, the ninth photosensitive film pattern, and the tenth photosensitive film pattern as masks to form a connection electrode operationally coupled with a portion of the pixel electrode and first and second connection lines operationally coupled with a portion of the common electrode on the common electrode.

20. The method of claim 19, where the first conductive film comprises a transparent conductive material such as indium tin oxide (ITO) or indium zinc oxide (IZO).

21. The method of claim 19, where the second conductive film comprise an opaque conductive material such as aluminum (Al), an aluminum alloy, tungsten (W), copper (Cu), chromium (Cr), or molybdenum (Mo).

22. The method of claim 19, where the first photosensitive film pattern, the second photosensitive film pattern, the third photosensitive film pattern, and the fourth photosensitive film patterns are patterned into the seventh photosensitive film pattern, the eighth photosensitive film pattern, the ninth photosensitive film pattern, and the tenth photosensitive film pattern respectively.

23. The method of claim 19, where the first thickness is thicker than the second thickness.

24. The method of claim 1, further comprising:

forming an n+ amorphous silicon thin film and a third conductive film on the first substrate;

forming a first photosensitive film pattern, a second photosensitive film pattern, a third photosensitive film pattern to a first thickness and a fourth photosensitive film pattern to a second thickness on the first substrate;

selectively removing a portion of the third conductive film through the first photosensitive film pattern, the second photosensitive film pattern, the third photosensitive film pattern, and the fourth photosensitive film pattern as masks to form a third conductive film pattern forming a data line comprised of the third conductive film;

selectively removing the n+ amorphous silicon thin film and a primary insulation film through the first photosensitive film pattern, the second photosensitive film pattern, the third photosensitive film pattern, the fourth photosensitive film pattern as masks to form a first n+ amorphous silicon thin film and a second n+ amorphous silicon thin film and a secondary insulation film pattern;

removing the fourth photosensitive film pattern while removing a portion of the first photosensitive film pattern, the second photosensitive film pattern, and the third photosensitive film pattern to form a fifth photosensitive film pattern, a sixth photosensitive film pattern, and a seventh photosensitive film pattern with a third thickness;

removing a portion of the third conductive film pattern through the fifth photosensitive film pattern, the sixth photosensitive film pattern, the seventh photosensitive film pattern as masks to form source and drain electrodes formed of the third conductive film; and selectively removing the first n+ amorphous silicon thin film, the second n+ amorphous silicon thin film through the fifth photosensitive film pattern, the sixth photosensitive film pattern, the seventh photosensitive film pattern as masks to form an active pattern.

25. The method of claim 24, where the third conductive film pattern has a narrower width than a portion of the first photosensitive film pattern and the second photosensitive film pattern and the fourth photosensitive film pattern at the lower portion of the portion of the first photosensitive film pattern and the second photosensitive film pattern and fourth photosensitive film pattern.

26. The method of claim 24, where the data line has a narrower width than a remaining portion of the first photosensitive film pattern.

27. The method of claim 24, where the first n+ amorphous silicon thin film pattern is formed at a lower portion of the first photosensitive film pattern.

28. The method of claim 24, where the secondary insulation film pattern is formed is formed at a lower portion of the first photosensitive film pattern.

29. The method of claim 24, where the second n+ amorphous silicon thin film pattern is formed near the lower portion of the first photosensitive film.

30. The method of claim 24, where the fifth photosensitive film pattern, the sixth photosensitive film pattern, the seventh photosensitive film pattern have almost the same width as the third conductive film pattern and the data line.

31. The method of claim 24, where the source electrode is formed at a lower portion of the fifth photosensitive film pattern.

32. The method of claim 24, where the drain and pixel electrodes are formed at a lower portion of the sixth photosensitive film pattern.

33. The method of claim 24, further comprising forming an ohmic-contact layer comprising the n+ amorphous silicon thin film at an upper portion of the active pattern.

34. The method of claim 33, where the pixel electrode line is operationally coupled to the connection electrode through the ohmic-contact layer.

35. The method of claim 24, further comprising forming a third n+ amorphous silicon thin film pattern and amorphous silicon thin film pattern, at a lower portion of the data line.

36. The method of claim 24, where the amorphous silicon thin film at the region where the second hole is formed is patterned to have almost the same as a width of the data line.

37. The method of claim 24, where the third conductive film comprises an opaque conductive material such as aluminum (Al), an aluminum alloy, tungsten (W), copper (Cu), chromium (Cr), or molybdenum (Mo).

* * * * *